United States Patent
De Bock et al.

(10) Patent No.: US 9,615,486 B2
(45) Date of Patent: Apr. 4, 2017

(54) THERMAL INTERFACE DEVICES

(71) Applicant: General Electric Company, Schenectady, NY (US)

(72) Inventors: Hendrik Pieter Jacobus De Bock, Clifton Park, NY (US); Jay Todd Labhart, Cary, NC (US); Shakti Singh Chauhan, Guilderland, NY (US); Graham Charles Kirk, Milton Keynes (GB); Joo Han Kim, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 192 days.

(21) Appl. No.: 14/225,461

(22) Filed: Mar. 26, 2014

(65) Prior Publication Data

US 2015/0282380 A1    Oct. 1, 2015

(51) Int. Cl.
*G06F 1/16*    (2006.01)
*H05K 5/00*    (2006.01)
(Continued)

(52) U.S. Cl.
CPC ........... *H05K 7/2039* (2013.01); *H01L 23/42* (2013.01); *H01L 23/427* (2013.01);
(Continued)

(58) Field of Classification Search
CPC .... H05K 7/20; H05K 7/2039; H05K 7/20454; G06F 1/20; H01L 23/42; H01L 23/427; H01L 23/433; H01L 23/4275; F28F 23/00
USPC ...... 361/679.46, 679.54, 700, 704, 705, 711, 361/719, 720, 709; 165/80.2, 80.3, 80.4, 165/104.33, 46, 185; 257/707, 713, 718, 257/719, 723; 29/890.03; 428/68, 323, (Continued)

(56) References Cited

U.S. PATENT DOCUMENTS 4,563,375 A * 1/1986 Ulrich ................. F28F 3/12
165/46
6,054,198 A    4/2000 Bunyan et al.
(Continued)

FOREIGN PATENT DOCUMENTS

DE    19811603 A1    9/1998
GB    2388473 A    11/2003

OTHER PUBLICATIONS

Vijay, "Solder-Tims (Thermal Interface Materials) for Superior Thermal Management in Power Electronics", Microelectronics and Packaging Conference (EMPC), 2011 18th European, pp. 1-8, Sep. 12-15, 2011.

(Continued)

*Primary Examiner* — Anthony Haughton
(74) *Attorney, Agent, or Firm* — Nitin N. Joshi

(57) ABSTRACT

A thermal interface device having a containment structure and a thermal conductor is provided. Further, the containment structure includes at least one wall, where the containment structure is configured to facilitate passage of heat. Furthermore, the thermal interface device includes a thermal conductor disposed at least in a portion of the containment structure. Moreover, the thermal conductor is configured to reversibly switch between a solid state and a liquid state. Also, the thermal interface device is a re-workable device.

23 Claims, 8 Drawing Sheets

(51) Int. Cl.
*H05K 7/00* (2006.01)
*H05K 7/20* (2006.01)
*H01L 23/42* (2006.01)
*H01L 23/427* (2006.01)
*H01L 23/433* (2006.01)

(52) U.S. Cl.
CPC ........ *H01L 23/4275* (2013.01); *H01L 23/433* (2013.01); *H01L 2924/15311* (2013.01)

(58) Field of Classification Search
USPC ........ 428/325, 353, 450; 524/432, 437, 495; 174/15.1, 16.3, 254
See application file for complete search history.

(56) References Cited

U.S. PATENT DOCUMENTS

| | | | |
|---|---|---|---|
| 6,081,428 A | 6/2000 | Fujimoto | |
| 6,238,596 B1 | 5/2001 | Nguyen et al. | |
| 6,885,557 B2 | 4/2005 | Unrein | |
| 7,063,127 B2* | 6/2006 | Gelorme | H01L 23/433 165/185 |
| 7,096,926 B2* | 8/2006 | Belady | F28F 23/00 165/104.21 |
| 7,219,713 B2* | 5/2007 | Gelorme | H01L 23/3733 165/185 |
| 7,253,523 B2* | 8/2007 | Dani | C09K 5/063 257/706 |
| 7,408,780 B2 | 8/2008 | Karidis et al. | |
| 7,545,647 B2 | 6/2009 | Karidis et al. | |
| 7,694,719 B2* | 4/2010 | Furman | H01L 23/433 165/185 |
| 7,709,951 B2* | 5/2010 | Brodsky | H01L 23/42 257/675 |
| 7,760,504 B2* | 7/2010 | Farrow | H01L 23/433 165/104.15 |
| 2002/0070445 A1* | 6/2002 | Tarter | H01L 23/4275 257/714 |
| 2003/0128519 A1* | 7/2003 | Justo | H01L 23/3737 361/704 |
| 2003/0153667 A1* | 8/2003 | Jayaraman | C08K 3/08 524/432 |
| 2003/0178174 A1* | 9/2003 | Belady | F28F 23/00 165/46 |
| 2004/0104467 A1 | 6/2004 | Viswanath | |
| 2004/0151885 A1 | 8/2004 | Jayaraman et al. | |
| 2004/0194915 A1* | 10/2004 | Belady | F28F 23/00 165/46 |
| 2005/0061474 A1* | 3/2005 | Gelorme | H01L 23/433 165/80.2 |
| 2007/0127211 A1 | 6/2007 | Macris et al. | |
| 2007/0287005 A1* | 12/2007 | Jayaraman | C08K 3/08 428/325 |
| 2008/0073775 A1 | 3/2008 | Brunschwiler et al. | |
| 2009/0040007 A1 | 2/2009 | Stenmark | |
| 2011/0308781 A1* | 12/2011 | O'Riordan | H01L 23/3737 165/185 |
| 2013/0032324 A1 | 2/2013 | Aldridge et al. | |
| 2013/0206363 A1 | 8/2013 | Kirk et al. | |
| 2013/0299140 A1 | 11/2013 | Ling et al. | |
| 2013/0308279 A1* | 11/2013 | Kim | H01L 23/373 361/720 |
| 2014/0183699 A1* | 7/2014 | Dahlstrom | H01L 23/3677 257/537 |
| 2014/0354314 A1* | 12/2014 | Arora | G01R 31/2877 324/750.09 |

OTHER PUBLICATIONS

Collins et al., "Development of a Process Friendly Film for High Performance Thermal Management Applications", Emerson & Cuming, pp. 1-6.
European Search Report and Opinion issued in connection with corresponding EP Application No. 15159553.5 on Sep. 1, 2015.

* cited by examiner

THERMAL INTERFACE DEVICES

BACKGROUND

Embodiments of the present specification relate to thermal interfaces, and more particularly to thermal interface devices.

Electronic devices often produce heat during operation that needs to be dissipated away from the electronic devices to prevent over heating of one or more components of the electronic devices. As will be appreciated, overheating of the components of the electronic devices may result in reduced reliability and/or failure of the electronic devices. Heat sinks are often used for dissipating heat away from the electronic devices. A heat sink is a passive component that is used to lower a temperature of an electronic device by dissipating heat away from the electronic device into the surrounding environment. In order for the heat sink to operate efficiently, the heat from the electronic device must be transferred to the heat sink over a thermal connection.

Typically, the electronic device includes a plurality of electronic components attached to a printed circuit board (PCB). One or more of these electronic components generate heat and may be referred to as "heat sources." Heat from these multiple components is transferred to one or more heat sinks using thermal connections. Each component on the PCB is disposed at a particular distance from the heat sink (tolerance) and the heat must be effectively transferred across the tolerance from the component to the heat sink. Accordingly, the tolerance is often filled with a thermal connector, such as a compliant heat spreader and/or thermal interface material. The thermal connector serves to provide an efficient thermal connection by filling up micro-voids present on a surface of a heat source and a surface of the heat sink. In addition, the thermal connector serves a mechanical function by providing a compliant mechanical connection between the heat source and the heat sink. It may be noted that typically the heat source and the heat sink have different coefficients of thermal expansion.

Additionally, when a single heat sink is used for the multiple electronic components, the thermal connectors are required to accommodate different tolerances pertaining to the multiple electronic components. It is desirable to employ the thermal connectors that are compressible and expandable to meet the demands of the different tolerances of the multiple electronic components. In some instances thermal pastes, thermal greases and thermally conductive pads may be used as the thermal connectors. However, typically, these thermal connectors have thermal conductivities as low as about 3 watts per meter Kelvin (W/mK). Although, thermally conductive pads may have thermal conductivities as high as about 17 W/mK, however, these thermally conductive pads can only be compressed between about 10% to about 20% of their original size. This limitation on the amount of compression possible for the thermally conductive pads limits a size of a gap between the electronic component and the heat sink. Further, this limitation on the amount of possible compression for the thermally conductive pads makes it difficult to accommodate these pads in an electronic assembly.

BRIEF DESCRIPTION

In accordance with aspects of the present specification, a thermal interface device having a containment structure and a thermal conductor is provided. The containment structure includes at least one wall, where the containment structure is configured to facilitate passage of heat. Further, the thermal interface device includes a thermal conductor disposed at least in a portion of the containment structure. Moreover, the thermal conductor is configured to reversibly switch between a solid state and a liquid state. Also, the thermal interface device is a re-workable device.

In accordance with another aspect of the present specification, a thermal interface assembly having a heat source, a heat sink and a thermal interface device disposed between the heat source and the heat sink. Further, the thermal interface device includes a containment structure and a thermal conductor is provided. The containment structure includes at least one wall, where the containment structure is configured to facilitate passage of heat. Also, the thermal interface device includes a thermal conductor disposed at least in a portion of the containment structure. Moreover, the thermal conductor is configured to reversibly switch between a solid state and a liquid state. Also, the thermal interface device is a re-workable device.

In accordance with yet another aspect of the present specification, a method for using a thermal interface device is provided. The thermal interface device includes a containment structure and a thermal conductor. The containment structure includes at least one wall, where the containment structure is configured to facilitate passage of heat. Further, the thermal interface device includes a thermal conductor disposed at least in a portion of the containment structure. Moreover, the thermal conductor is configured to reversibly switch between a solid state and a liquid state. Also, the thermal interface device is a re-workable device. Further, the method includes compressing at least a portion of a thermal interface device, removably disposing the thermal interface device on at least a portion of a heat source, and disposing a heat sink directly on the thermal interface device. Further, the method includes de-compressing the compressed portion of the thermal interface device to provide a path of low thermal resistance between the heat source and the heat sink via the thermal interface device, and providing power to an electronic system, wherein the electronic system employs the heat source and the heat sink.

DRAWINGS

These and other features, aspects, and advantages of the present specification will become better understood when the following detailed description is read with reference to the accompanying drawings in which like characters represent like parts throughout the drawings, wherein.

DETAILED DESCRIPTION

Figure 1:
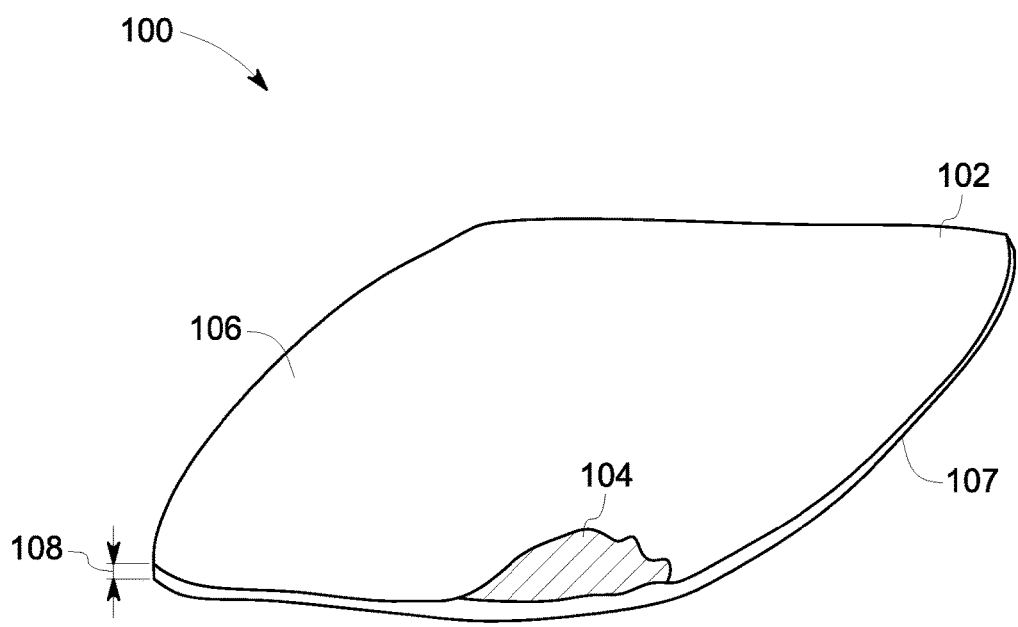
FIG. 1 is a perspective view of an exemplary thermal interface device having a containment structure and a thermal conductor disposed at least in part in the containment structure, in accordance with aspects of the present specification.

Embodiments of the present specification provide a thermal interface device that is configured to be removably disposed between a heat source and a heat dissipater. As used herein, the term heat dissipater may entail, any structure or material that is configured to directly or indirectly or actively or passively direct the heat away from the heat source. Non-limiting examples of the heat dissipater may include a heat sink, a heat frame, a thermoelectric module, a chassis, a heat pipe, a vapor chamber, or combinations thereof. Further, as used herein, the term "heat sink" is used to generally refer to all types of heat sink devices, including heat pipe modules and thermal ground planes. In certain embodiments, the heat source may include an active heat source or a passive heat source. It may be noted that the active heat source may be configured to generate heat. Further, it may be noted that the passive heat source may not be able to generate heat, however, the passive heat source but may be configured to carry heat from the active heat source. Non-limiting examples of the active heat source may include electronic components, such as, but not limited to, an electronic chip. Further, non-limiting examples of the passive heat source may include heat spreaders, such as a heat pipe.

Advantageously, the thermal interface device of the present specification may be easily coupled and decoupled from surrounding structures, such as, but not limited to, the heat frame, the heat spreader, the heat sink, and/or the heat source. Also, the thermal interface device is configured to facilitate enhanced heat transfer between the heat source and the heat dissipater by providing a path with reduced thermal resistance. Further, owing to the flexibility in shape, volume and size, the thermal interface device is configured to accommodate a variety of tolerances between multiple components of the heat source and the heat dissipater. Furthermore, the compliant nature of the thermal interface device accommodates mechanical and/or thermal growth and/or shrinkage of the heat dissipater and the heat source that may otherwise occur due to mismatch in coefficients of thermal expansions of the heat source and the heat dissipater.

In some embodiments, the thermal interface device may include a containment structure that provides a deformable reservoir to house a thermal conductor. Further, in some embodiments, the thermal interface device may include one or more shape changing components. In an operation stage, the shape changing components may be configured to provide a selective shape change in the containment structure such that at least a portion of the containment structure is in thermal communication with the heat source and/or the heat dissipater. Further, the one or more shape changing components may be disposed in the containment structure. In one embodiment, the shape changing components may be disposed in the thermal conductor, where the thermal conductor is disposed in the containment structure. Further, in embodiments where the containment structure has a plurality of layers, the shape changing components may be disposed in one or more layers of the plurality of layers of the containment structure. By way of example, the shape changing components may be coupled to an inner side of a retainer layer of the containment structure. Moreover, in alternative embodiments, the shape changing components may be disposed in both the thermal conductor as well as in one or more layers of the containment structure.

Further, the shape changing components may be configured to provide a spring force. In some embodiments, the shape changing components may be configured to reversibly transform into a different shape. The amount of deformation for the transformation of the shape changing component may be a function of a spring force provided by the shape changing components. Further, in certain embodiments, the spring force may be determined as a function of a desirable amount of deformation needed to provide a physical contact between the containment structure and the neighboring surface, such as, but not limited to, the heat source and the heat dissipater.

Non-limiting examples of the shape changing components may include spring like structures, mesh like structures, micro particles, nano-particles, nano-tubular structures, elastomers, fluid containment structures, compliant material containment structures, or combinations thereof. The type of shape changing components may be selected based on the amount of spring force desired. By way of example, the shape changing components may be selected based on the material of the containment structure, the thickness of the one or more layers of the containment structure, distance between a surface of the thermal interface device and the neighboring layer, such as, the outer surface of the heat dissipater and/or heat source. Moreover, the number of shape changing components and positioning of the shape changing components disposed in the containment structure may be determined based on the amount of spring force desired, and the locations on the thermal interface device where the spring force is desired to provide path of least thermal resistance between the heat source and the heat dissipater.

Advantageously, the deformation or the transformation of the shape changing components may be reversible in nature. Also, the shape change of the containment structure resulting from the transformation of the shape changing components may be at least partially reversible. For example, during the operation stage, as a result of the transformation of the shape changing components the shape of the containment structure may change, however, after the operation stage, the shape changing components may at least partly transform back to their respective initial shapes, and the shape of the containment structure may also change accordingly.

As used herein, the term "assembly temperature" refers generally to a temperature at which the thermal interface device is being formed or operatively coupled to another device, assembly, or component. By way of example, the assembly temperature may refer to a temperature at which at least a portion of the thermal interface device may be re-shaped to facilitate disposing the thermal interface device between a heat dissipater and a heat source in an electronic system. Similarly, as used herein, the term "assembly stage" refers to the stage of the electronic system when the thermal interface device is being operatively coupled to the electronic system. By way of example, the assembly stage may refer to the stage when the thermal interface device is being re-shaped to dispose the thermal interface device in the electronic system, or when the thermal interface device is being heated to melt the thermal conductor in the containment structure to enable the thermal interface device to at least in part regain its original shape. Accordingly, the assembly stage may refer to any time before or sometime after the operation of the electronic system when the electronic system is at the assembly temperature. It may be noted that the thermal conductor may be in a liquid state or a solid state in the assembly stage.

Further, as used herein the term "operating temperature" is used to refer to the temperature at which the electronic system including the thermal interface device is performing an assigned operation. Also, as used herein, the term "operation stage" refers to the stage of the electronic system when the electronic system is performing an assigned function. In one embodiment, at the beginning of the operation stage, as the temperature of the heat source increases, the heat is transferred to the heat dissipater through the thermal interface device. Also, in one embodiment, when the operation of the system has stabilized, the heat transfer from the heat source to the heat dissipater may be facilitated through the thermal conductor. In one embodiment, the assembly temperature may be less than about 85° C. Also, in another embodiment, the assembly temperature may be in a range from about 0° C. to about 50° C. In yet another embodiment, the assembly temperature may be in a range from about 15° C. to about 25° C. In certain embodiments, the operating temperature may be greater than the assembly temperature. In one example, the operating temperature may be greater than about 30° C. In a particular example, the operating temperature may be in a range from about 50° C. to about 125° C.

In certain embodiments, the thermal interface device may include one or more conforming components operatively coupled to the containment structure. The conforming components allow for a volume change of the containment structure and the thermal interface device. The conforming components may either form an integral part of the containment structure or may be physically separate entities that may be operatively coupled to the containment structure. In one embodiment, the conforming components may be disposed on the containment structure. Non-limiting examples of the conforming components may include a bellow structure, a flexible membrane, or combinations thereof.

In certain embodiments, the conforming components may also be configured to provide a spring force to the containment structure. However, in these embodiments the amount of spring force provided by the conforming components may be relatively lower than the amount of spring force provided by the shape changing components.

FIG. 1 illustrates an exemplary thermal interface device 100 of the present specification. The thermal interface device 100 includes a containment structure 102 and a thermal conductor 104. Further, the containment structure 102 may be an enclosed structure having at least one wall. In the illustrated embodiment, the containment structure 102 includes two walls 106 and 107. Further, the containment structure 102 includes a conformable reservoir. Moreover, the thermal conductor 104 may be disposed in at least a portion of the containment structure 102. In particular, the thermal conductor the thermal conductor 104 may be disposed in the conformable reservoir of the containment structure 102. Further, the containment structure 102 is configured to encompass at least in part the thermal conductor 104. Also, the thermal conductor 104 is configured to reversibly switch between a solid state and a liquid state. In particular, the conformable reservoir formed by the containment structure 102 may be expanded or contracted to a certain degree as required. By way of example, the conformable reservoir may be contracted at assembly stage to facilitate assembling the electronic system having the thermal interface device 100. In particular, in the assembly stage, at least a portion of the conformable reservoir having the thermal conductor 104 may be compressed to facilitate disposing the thermal interface decide 100 between a heat dissipater (not shown) and a heat source (not shown). For example, at least a portion of the conformable reservoir may be compressed by first heating the thermal interface device 100 to temporarily melt the thermal conductor 104, and subsequently applying a determined amount of pressure to compress the portion of the conformable reservoir of the thermal interface device 100 to a desirable extent. Subsequently, in the assembly stage, the thermal interface device 100 disposed between the heat dissipater and the heat source may be re-heated to temporarily melt the thermal conductor 104 to enable flow of at least a portion of the thermal conductor 104 in the compressed area of the conformable reservoir to facilitate the thermal interface device 100 to at least partially regain its original shape. In embodiments where the thermal interface device 100 employs conforming components, the conforming components facilitate the movement of the thermal conductor 104 in the conformable reservoir during the assembly stage of an electronic assembly employing the thermal interface device 100.

In accordance with embodiments of the present specification, the thermal interface device 100 is configured to facilitate heat transfer between the heat source and the heat dissipater. In instances where the thermal interface device 100 is disposed in an arrangement where the heat source is disposed adjacent the wall 106 of the containment structure 102 and the heat dissipater is disposed adjacent the wall 107 of the containment structure 102, in the operation stage, the thermal interface device 100 is configured to facilitate the transfer of heat from the heat source to the heat dissipater. In particular, the containment structure 102 is configured to allow heat from the heat source to pass through the wall 106 of the containment structure 102 and the thermal conductor 104 and out of the containment structure 102 through the wall 107. The heat from the wall 107 may be passed to the heat dissipater.

In certain embodiments, the thermal interface device 100 is a re-workable structure. As used here, the term "re-workable" refers to a characteristic of the thermal interface device 100 that enables the thermal interface device 100 or the heat source to be removed from an electronic system without requiring extra processing steps which are otherwise needed in case of conventional thermal interface materials. Further, in some embodiments, the thermal interface device 100 is suitable for use in places where one or more components between which the thermal interface device 100 is disposed need to be removed and re-inserted more than once. By way of example, the thermal interface device 100 facilitates removing and re-inserting the heat source and/or the heat dissipater in the electronic assembly without any need for additional process steps, such as surface cleaning, of the heat source and/or the heat dissipater. It may be noted that conventional thermal interface materials tend to adhere to a surface of the heat source and/or the heat dissipater. Hence, when using the conventional thermal interface materials, there exists a need for cleaning the surface of the heat source and/or the heat dissipater while removing or before re-inserting the heat source and/or the heat dissipater in the electronic assembly to remove the thermal interface materials.

Further, in some embodiments, the thermal interface device 100 is a flexible structure that may be deformable. The thermal interface device 100 is deformable by virtue of the containment structure 102 being flexible and deformable. By way of example, the thermal interface device 100 may be configured to be deformed or re-shaped to a desirable extent to enhance physical contact between the heat source and the heat dissipater. In some embodiments, a thickness 108 of the thermal interface device 100 may be such that the thermal interface device 100 is flexible while also having adequate mechanical strength to contain the thermal conductor 104 as well as endure a range of temperatures and stress during and after operation. In one example, the thickness 108 of the thermal interface device 100 may be in a range from about 25 microns to about 500 microns.

Further, in one example at least a portion of the thermal interface device 100 may be compressed to reduce the thickness to about 20% or more of the original thickness value. In one embodiment, reduction in thickness of the portion of the thermal interface device 100 in the assembly stage may be in a range from about 40% to about 80% of the original thickness value. Typically, the compressed portion of the thermal interface device 100 is disposed between the heat source and the heat dissipater. Advantageously, compressing the portion of the thermal interface device 100 to a larger extent allows the thermal interface device 100 to be employed in electronic assemblies that have relatively smaller gaps between the heat source and the heat dissipater. Moreover, compressing the portion of the thermal interface device 100 to a larger extent enables disposing the thermal interface device 100 easily between the heat source and the heat dissipater. By way of example, compressing the portion of the thermal interface device 100 to a larger extent enables disposing the thermal interface device 100 between the heat source and the heat dissipater without undesirably disturbing the arrangement of the heat source and the heat dissipater in the electronic assembly.

In certain embodiments, the containment structure 102 may be made of an electrically insulating polymer, a thermally conductive metal, a thermally conductive metal alloy, or combinations thereof. Non-limiting examples of the materials used for the containment structure 102 may include copper, graphene, silicone, aluminum, polyvinyl chloride, polyimide, polyurethane, polyester, polyamide, or combinations thereof. In a particular example, the containment structure 102 may be made of materials, such as, but not limited to, Teflon®, Mylar®, Kevlar®, or combinations thereof. Further, the thermal conductor 104 is made of a material that is configured to reversibly switch between a solid state and a liquid state. By way of example, the thermal conductor 104 may be in the liquid state at the assembly temperature. Further, the thermal conductor 104 may solidify when the thermal interface device 100 cools down to a near room temperature or the assembly temperature. Moreover, the thermal conductor 104 may remain in the solid state at the operating temperature of the thermal interface device 100. In one example, the thermal conductor 104 may have a melting temperature in a range from about 40° C. to about 250° C. In another example, the thermal conductor 104 may have a melting temperature in a range from about 60° C. to about 160° C. Non-limiting examples of the thermal conductor 104 may include In, InBi, InSn, BiSn, PbSn, SnAg, InPbAg, InAg, InSnBi, InGa, SnBiZn, SnInAg, SnAgCu, SnAgBi, InPb, or combinations thereof. Further, in certain embodiments, the thermal conducting properties of the thermal conductor 104 may be enhanced by disposing one or more thermally conducting fillers in the thermal conductor. Non-limiting examples of such fillers may include particles or other nano-sized structure or micro-sized structures of materials, such as, but not limited to, diamond particles, copper particles, graphene particles, or combinations thereof. Moreover, the thermal interface device 100 may have a thermal conductivity in a range from about 20 W/mK to about 400 W/mK.

In certain embodiments, the walls 106 and/or 107 of the containment structure 102 may be a solid structure. By way of example, the walls 106 and/or 107 may be a solid layer. In certain other embodiments, the walls 106 and/or 107 may be a hollow layer. Further, in some embodiments, the walls 106 and/or 107 may be a patterned structure. For example, in some of these embodiments, the walls 106 and/or 107 may be in the form of a mesh. Moreover, the walls 106 and/or 107 may include a continuous or discontinuous structure.

Further, each of the walls 106 and/or 107 may include a single layer or a plurality of layers. As will be described with respect to FIGS. 2-4, the walls 106 and/or 107 of the containment structure 102 may include one or more of a retainer layer, a diffusion barrier, a protection layer, or combinations thereof. Further, in one embodiment, the retainer layer may be primarily configured to retain the thermal conductor and/or provide mechanical integrity to the thermal interface device 100. Moreover, in instances where the protection layer is employed, the protection layer may be disposed on the retainer layer on the outside of the containment structure 102. The protection layer may be configured to provide protection, such as thermal, mechanical, and electrical protection to the thermal interface device 100. In one embodiment, the protection layer may be an electrically insulating layer. Further, in instances where the diffusion barrier is employed, the diffusion barrier may be disposed so as to facilitate prevention or at least reduction in diffusion of the thermal conductor 104 into the material of the walls 106 and/or 107 of the containment structure 102. In some embodiments, the retainer layer may be configured to act as the protection layer and the diffusion barrier, in these instances, the containment structure 102 may include the retainer layer and the thermal conductor 104 disposed in the retainer layer. Non-limiting examples of the materials of the retainer layers where the retainer layer is configured to act as both the protection layer and the diffusion barrier may include polyurethane, copper, polyimide, polyamide, polyester, or combinations thereof.

Additionally, in some embodiments, at least one wall 106 or 107 of the containment structure 102 may be different from the other wall 107 or 106. By way of example, one of the walls 106 or 107 may include an electrically insulating layer, whereas, the other wall 107 or 106 which is not in direct physical contact with the electronic component may not include the electrically insulating layer.

It may be noted that the thermal interface device 100 may in general be smaller or larger in size than one or more surfaces to which the thermal interface device 100 is operatively coupled to. By way of example, the thermal interface device 100 may be bigger or even smaller than an electrical component (not shown) to which the thermal interface device 100 is being operatively coupled to.

Figure 2:
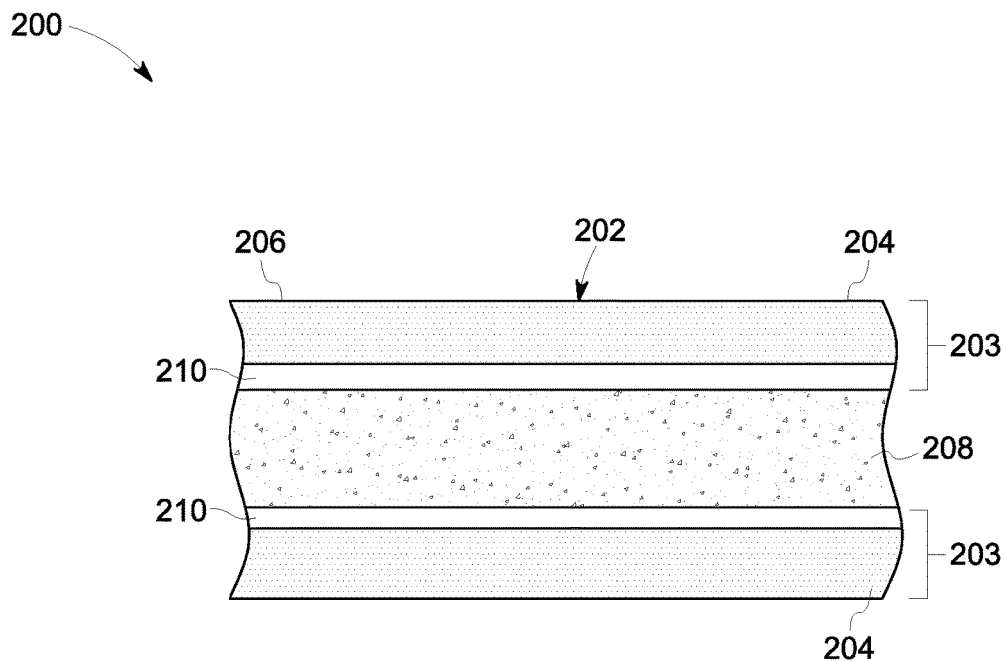
FIGS. 2-4 are cross-sectional views of different embodiments of thermal interface devices having a containment structure and a thermal conductor, in accordance with aspects of the present specification.

FIG. 2 illustrates a portion 200 of a thermal interface device 202 having walls 203 of a containment structure 206. The portion 200 further includes a thermal conductor 208. Further, the walls 203 may include one or more layers. In the illustrated embodiment, each of the walls 203 includes a retainer layer 204 and a diffusion barrier 210. The diffusion barrier 210 is disposed between the retainer layer 204 and the thermal conductor 208. Further, the diffusion barriers 210 may be employed to arrest at least in part any undesirable diffusion of the material of the thermal conductor 208 into the retainer layers 204. By way of example, in instances where the containment structure 206 is made of a polymer material, the diffusion bathers 210 may be employed to curtail the diffusion of the thermal conductor 208, specifically, when the thermal conductor 208 is in a liquid state, into the retainer layers 204 of the containment structure 206. The diffusion barrier 210 may or may not be employed in instances where the retainer layers 204 of the containment structure 206 are made of materials that are not prone to diffusion from the material of the thermal conductor 208. In one example, a thickness of the at least one retainer layers 204 of the containment structure 206 is in a range from about 1 nm to about 100 microns.

Figure 3:
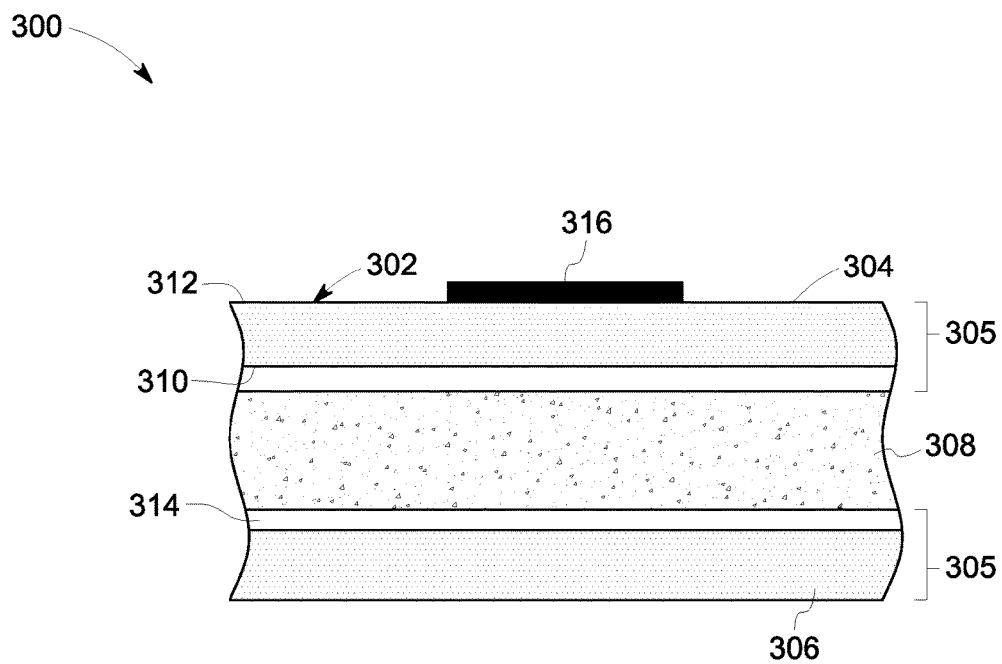

FIG. 3 illustrates a portion 300 of a thermal interface device 302 having a containment structure 304 including walls 305. The thermal interface device 302 further includes a thermal conductor 308 disposed at least in a portion of the containment structure 304. Also, each of the walls 305 includes a retainer layer 306 having a first side 310 and a second side 312. Further, each of the walls 305 includes a diffusion barrier 314 disposed on the first side 310 of the retainer layers 306. Further, at least one of the walls 305 may include an electrically insulating layer 316 disposed on at least a portion of the second side 312 of one of the retainer layers 306. The electrically insulating layer 316 may be disposed such that the electrically insulating layer 316 is positioned between a heat source (not shown) and the thermal interface device 300 to prevent electrical shorting between the heat source and the thermal interface device 300. By way of example, the insulating layer 316 is disposed between the containment structure 304 and an electronic chip. In one example, the insulating layer 316 may include one or more dielectric materials. Further, in some embodiments, where the containment structure 302 is made of an electrically conducting material, it is desirable to avoid electrical shorting between the heat source and the thermal interface device 300. Hence, using the electrically insulating layer 316 may be highly desirable in such instances.

Figure 4:
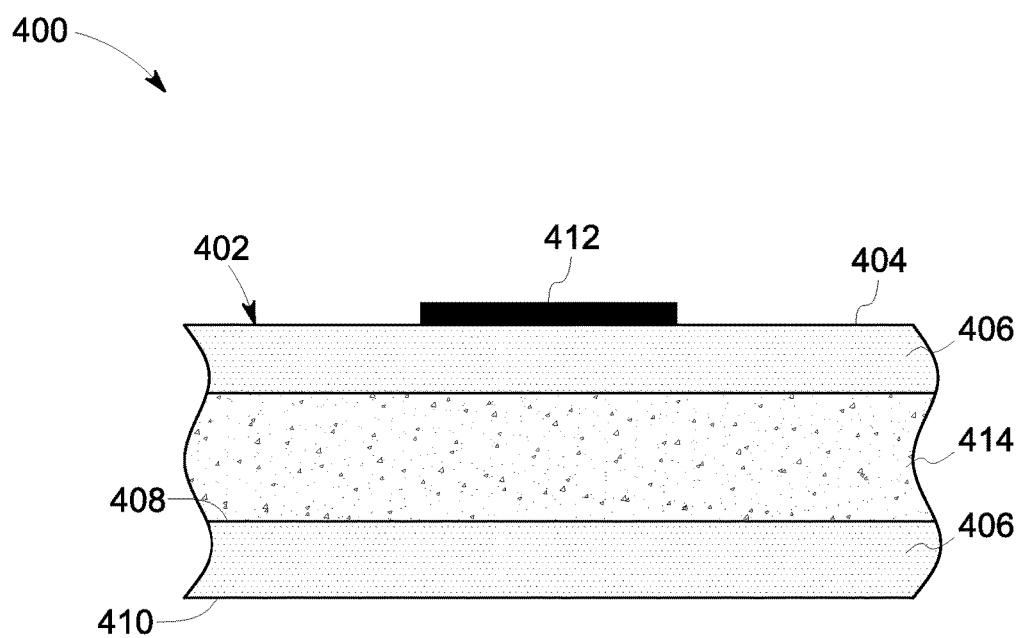

FIG. 4 illustrates a portion 400 of a thermal interface device 402 having a containment structure 404. The containment structure 404 includes retainer layers 406. Further, each of the retainer layers 406 have a first side 408 and a second side 410. Further, the walls 406 include an electrically insulating layer 412 that may be disposed on at least a portion of the second side of the 410 of at least one of the retainer layers 406 of the containment structure 404. Moreover, a thermal conductor 414 is disposed in a reservoir formed between the first sides 408 of the retainer layers 406.

Figure 5:
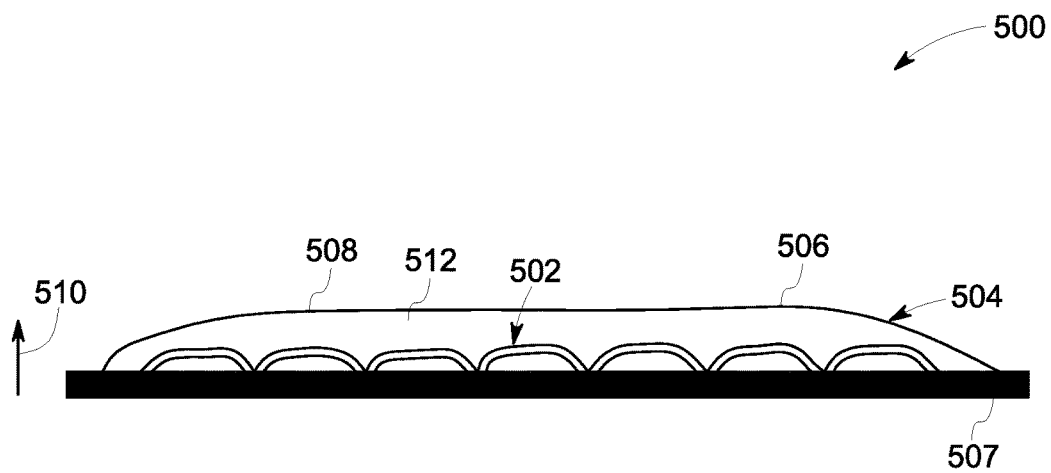
FIG. 5 is a cross-sectional view of a thermal interface device having a shape changing component, in accordance with aspects of the present specification.
Figure 6:
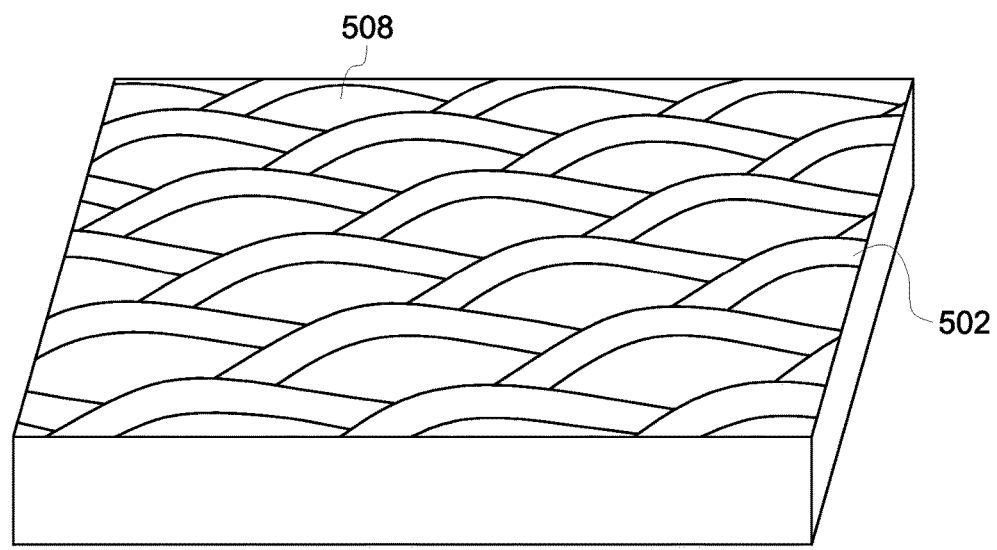
FIG. 6 is a perspective view of a portion of the thermal interface device of FIG. 5, in accordance with aspects of the present specification.

FIGS. 5-6 illustrate embodiments of a thermal interface device 500 where a shape changing component is employed in a containment structure 504. In certain embodiments, the shape changing component may be configured to provide a spring force. In the illustrated embodiment, the shape changing component may be a mesh structure 502. The mesh structure 502 may be configured to provide a spring force to facilitate an enhanced physical contact between the thermal interface device 500 and a heat dissipater (not shown), a heat sink (not shown), or both. In one example, the mesh structure 502 may be configured to expand in one or more directions. The change in the shape of the thermal interface device 500 is configured to facilitate an enhanced heat transfer path between the heat source and the heat dissipater by providing a path of least thermal resistance.

Further, the mesh structure 502 is configured to be disposed in at least a portion of the containment structure 504. Also, the mesh structure 502 may be configured to contain at least a portion of a thermal conductor 512. In one example, the mesh structure 502 may be made from a beryllium-copper alloy. In the same or different example, the containment structure 504 may be made of a copper or steel panel that is flexible and may be easily curved to accommodate any curvature or non-co-planarity between the thermal interface device 500 and the heat source. In the illustrated embodiment, the containment structure 504 may be flexible enough to accommodate and re-shape according to the change in the curvature of the mesh structure 502.

Further, a thickness of walls 508 of the containment structure 504 may be determined based on a desirable or expected change in the curvature of the mesh structure 502 contained within the containment structure 504. In some embodiments, the mesh structure 502 may be configured to rise by about 100 microns to about 500 microns depending on a thickness of the walls 508 of the containment structure 504 and design of the mesh structure 502. Non-limiting examples of one or more properties of the mesh structure 502 that may be modified to obtain a desirable change in the shape of the mesh structure and hence, a desirable change in the shape of the thermal interface device 500 may include thickness of the mesh, material of the mesh, a pore size of the mesh, or combinations thereof. In one embodiment, the thermal interface device 500 may be formed by providing a pre-form of the thermal conductor 512. Next, the mesh structure 502 may be disposed on the pre-form. By way of example, the mesh structure 502 may be directly formed on the pre-form. Subsequently, the containment structure 504 may be disposed around the mesh structure 502.

In the illustrated embodiment, the containment structure 504 includes a first wall 506 and a second wall 507. The mesh structure 502 may be disposed between the first and second walls 506 and 507 such that during the operation stage, the mesh structure 502 may push the first wall 506 in a first direction, generally represented by an arrow 510. The resultant ballooning of the containment structure 504 facilitates a desirable contact between the thermal interface device 500 and one or more neighboring components, such as a heat source and/or heat dissipater.

In the illustrated embodiment, the mesh structure 502 may be disposed in the containment structure 504 along with a thermal conductor 512. The mesh structure 502 may be configured to swell during operation due to increase in temperature. By way of example, the mesh structure 502 may be configured to swell upon coming in contact with the hot thermal conductor 512 during the operation stage, thereby, pushing the first wall 506 in the direction 510. Further, after the operation stage, when it is no more required to provide a thermal path between the thermal interface device 500 and the neighboring components, at least a portion of the mesh structure 502 may de-swell. In one embodiment, the mesh structure 502 may regain original shape, whereas, in other embodiment, the mesh structure 502 may not completely retain the original shape and form.

Although not illustrated, in some embodiments a thermal interface device 500 may only include the thermal conductor 512 and a mesh structure disposed on the thermal conductor. In these embodiments, the thermal interface device may not include an additional containment structure, and the mesh structure may be configured to act as the containment structure. Further, in these embodiments, the mesh structure may be configured to operatively couple to one or more of a heat source and a heat dissipater.

Figure 7:
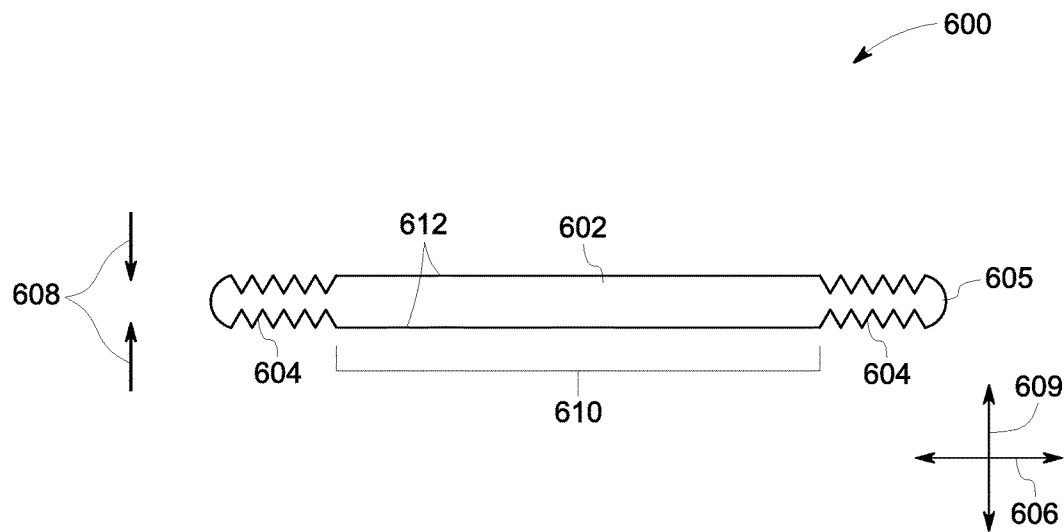
FIG. 7 is a side view of a thermal interface device having a containment structure employing conforming components, in accordance with aspects of the present specification.
Figure 8:
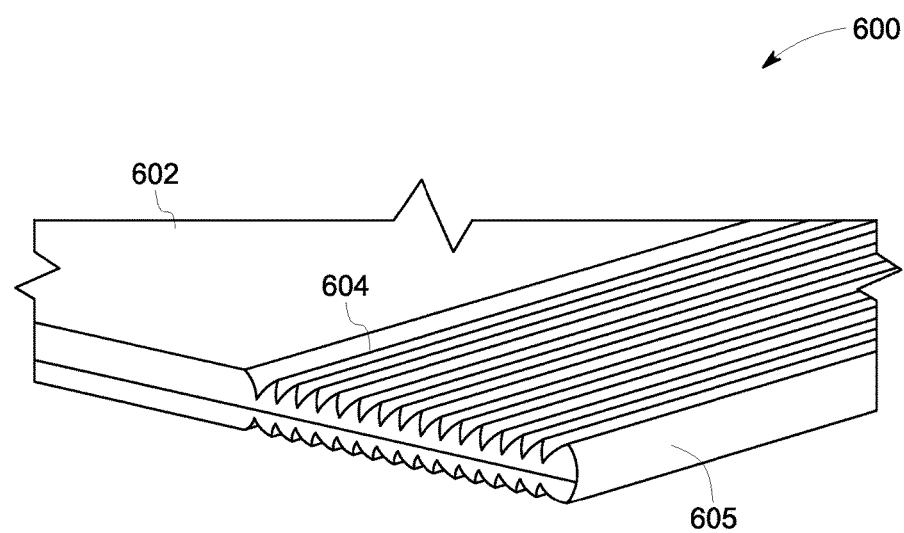
FIG. 8 is a perspective view of a portion of the thermal interface device of FIG. 7, in accordance with aspects of the present specification.

FIGS. 7-8 illustrate a thermal interface device 600. The thermal interface device 600 includes a containment structure 602 configured to contain or retain a thermal conductor (not shown). Further, the containment structure 602 includes two walls 612. In one embodiment, the containment structure 602 includes bellows 604 as conforming components. The bellows 604 form an integral part of the containment structure 602. In one embodiment, the bellows 604 may be configured to accommodate at least a portion of the thermal conductor. Further, the bellows 604 may be configured to expand or contract in the direction represented by arrows 606. In one embodiment, the bellows may have rounded edges 605. The rounded edges 605 may facilitate further expansion of the bellows 604. By way of example, when the thermal interface device 600 is disposed between the neighboring surfaces, such as the surfaces of a heat source and a heat dissipater, a portion of the containment structure 602 of the thermal interface device 600 may be compressed in a direction represented by arrows 608. Further, in the assembly stage, during compression of the thermal interface device 600, the thermal conductor may be pushed into the volume of the bellows 604. Moreover, in the operation stage, when the thermal conductor is heated and the containment structure 602 expands in the direction 609, the thermal conductor may be pushed out of the bellows and into the region 610. In the operation stage, the containment structure region 610 and the bellows 604 may regain their respective original shapes.

In the illustrated embodiment, the walls 612 of the containment structure 602 may have a plurality of layers. Further, the walls 612 may have a uniform or non-uniform constitution through the length of the walls 612. In particular, a portion of the walls 612 into the region 610 may have a constitution that is different from a constitution of a portion of the walls 612 disposed in the region of the containment structure 602 having the bellows 604. By way of example, the region 610 of the containment structure 602 may include a retainer layer (not shown), a protection layer (not shown), a diffusion barrier (not shown), and the region having the bellows 604 may have only the retainer layer. In some embodiments, it may be desirable to have lower number of layers in the bellows 604 to further enhance the flexibility of the bellows 604. In one example, the containment structure 602 may include a retainer layer having a first side and a second side. The retainer layer may include a diffusion barrier disposed on the first side of the retainer layer. Further, the retainer layer may include a protection layer disposed on the second side of the retainer layer. In one embodiment, the retainer layer may be made of copper or a copper based alloy. Also, in one embodiment, the diffusion barrier and the protection layer may be made of nickel or a nickel based alloy. In one example, the thermal conductor may be disposed in the containment structure as a pre-form. In this embodiment, the thermal interface device 600 may be formed by first providing a pre-form of the thermal conductor material. Further, layers of containment structure 602 may be successively deposited directly on the pre-form.

In one embodiment, the thermal interface device 600 may be heated to melt the thermal conductor disposed in the containment structure 602 prior to disposing the thermal interface device in an arrangement. In the illustrated embodiment, the thermal interface device 600 may be heated. Upon heating the thermal interface device 600, the thermal conductor may melt. While the thermal conductor is in a liquid state, at least a portion of the thermal interface device 600 may be compressed in the region 610 of the containment structure 602 to suitably reduce the thickness of the containment structure 602 prior to disposing the thermal interface device 600 in the arrangement. Subsequently, the thermal interface device 600 may be allowed to cool. Compressing the thermal interface device 600 in the region 610 may result in at least a portion of the thermal conductor being moved to the regions having the bellows 604. Further, the bellows 604 are configured to expand in the directions 606 and 609 to accommodate the displaced thermal conductor. The thermal conductor may solidify in the region having the bellows 604. Subsequently, after disposing the thermal interface device 600 in the assembly, the thermal interface device 600 may be re-heated to enable the thermal interface device 600 to at least partly regain the original shape by at least partly de-compressing the compressed portion of the thermal interface device 600. In the assembly stage, during re-heating, the thermal conductor may melt and the bellows may attempt to regain their original shape, thereby pushing the thermal conductor back in the region 610, and enabling the thermal interface device 600 to at least partly regain its original shape. It may be noted that the thermal interface device 600 in its original shape may be configured to provide a continuous thermally conductive path between the heat source and the heat dissipater.

Additionally, in some embodiments, the containment structure 602 or the thermal conductor may include shape changing components, such as but not limited to, spring like structures, mesh, or both, to expand the volume of the containment structure 602. In particular, the shape changing components may be configured to modify a shape of the region 610 to facilitate physical contact between the surfaces of the containment structure 602 and surfaces of the heat dissipater and/or the heat source.

Figure 9:
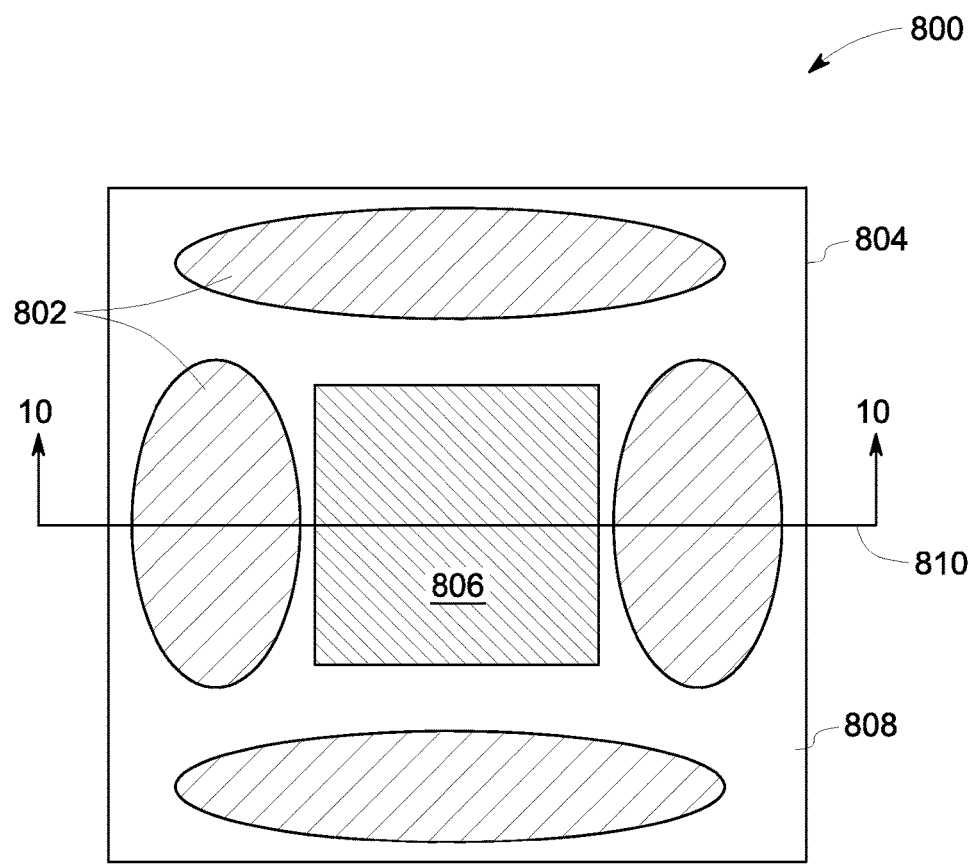
FIG. 9 is a top view of a thermal interface device employing conforming components, where the conforming components are disposed on a portion of the containment structure, in accordance with aspects of the present specification.
Figure 10:
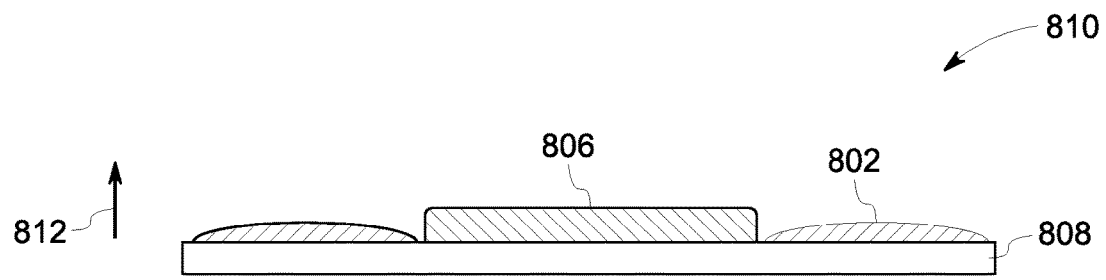
FIG. 10 is a cross-sectional side view of the thermal interface device of FIG. 9 along the line 10-10, in accordance with aspects of the present specification.

FIGS. 9-10 illustrate embodiments of a thermal interface device 800 employing a plurality of conforming components 802. Further, the plurality of conforming components 802 is disposed on a containment structure 804 of the thermal interface device 800. One or more conforming components 802 of the plurality of conforming components 802 may be same or different than the other conforming components 802. Alternatively, in some embodiments, in place of the plurality of conforming components 802, a single conforming component may be disposed on the containment structure 804. Also, the number of components in the plurality of conforming components 802 may vary depending on one or more factors. Non-limiting examples of such factors may include a size of the heat source, a size of the heat dissipater, a size of the thermal interface device, material of the containment structure 804, a gap between the heat source and the heat dissipater, a desirable amount of change in a volume of the containment structure desirable, structure of the conforming components, material of the conforming components themselves, size of the conforming components, or combinations thereof.

In the illustrated embodiment, the conforming components 802 may be integrated with the containment structure 804 such that a thermal conductor may be allowed to move between the containment structure 804 and the conforming components 802 in the assembly stage. Further, the conforming components 802 may be configured to expand and contract to accommodate volume displacement from the heat source and/or the heat dissipater. In some embodiments, an electrically insulating layer 808 may be disposed on regions other than a region 806 of the containment structure 804. Further, the electrically insulating layer 808 may be a thermally conducting layer. FIG. 9 illustrates a cross-section of the thermal interface device 800 cut along the line 810. As illustrated, the conforming components 802 are elevated structures that are elevated with respect to a surface of the containment structure 804 on which they are disposed. In the operation stage, the conforming components 802 may expand at least in a direction represented by arrows 812. As illustrated, the region 806 of the containment structure 804 is configured to be in thermal contact with a heat source (not shown). The region 806 configured for contact with a heat source (not shown) may be elevated (e.g., 50 microns) by selective plating.

Figure 11:
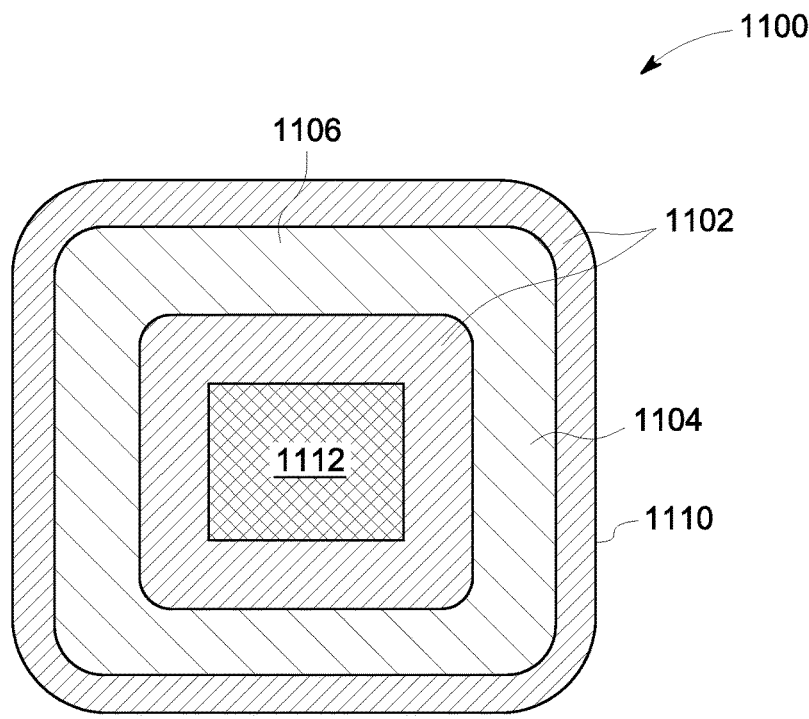
FIG. 11 is a top view of a thermal interface device having a containment structure, where the containment structure employs a flexible membrane, in accordance with aspects of the present specification.
Figure 12:
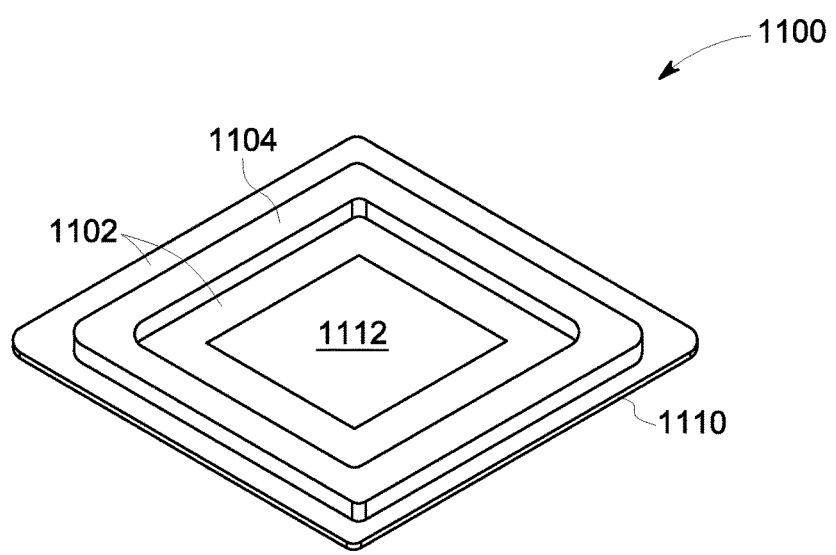
FIG. 12 is a perspective view of the thermal interface device of FIG. 11, in accordance with aspects of the present specification.

FIGS. 11-12 illustrate another embodiment of a thermal interface device 1100 of the present specification. In the illustrated embodiment, the thermal interface device 1100 includes a containment structure, which is a copper reservoir 1102. The copper reservoir 1102 may include smooth surfaces. Portions 1104 of the copper reservoir 1102 may be removed (e.g., etched away) to expose a portion of a thermal conductor 1104 disposed in the copper reservoir 1102.

In certain embodiments, the thermal interface device 1100 includes conforming components. In the illustrated embodiment, the conforming component is a flexible membrane 1106 that is disposed on the portions 1104 of the copper reservoir 1102. Further, the flexible membrane 1106 may be coupled to portions of the copper reservoir 1102 that are adjacent the portions 1104. The flexible membrane 1106 may be used to shield the exposed thermal conductor. The flexible membrane 1106 may be made of a thermally conducting and electrically insulating material. Further, the flexible membrane 1106 may be configured to swell or expand during the operation stage or the assembly stage. By way of example, the flexible membrane 1106 may be configured to expand to accommodate the thermal conductor in the liquid state, when a portion of the thermal interface device 1100 is compressed. In particular, in the assembly stage, when the thermal interface device 1100 is heated, and the thermal conductor is melted, at least a portion of the volume of the thermal conductor in the copper reservoir 1102 may be pushed into the portions 1104, thereby causing the flexible membrane 1106 to swell or expand. Additionally, the flexible membrane 1106 may be configured to at least in part contract and regain its original shape once the thermal interface device 1100 is re-heated to push at least a portion of the thermal conductor into a compressed region of the thermal interface device.

Additionally, in some embodiments, the material of the flexible membrane 1106 may be elastic in nature, and may be configured to regain the shape of the flexible membrane after it has expanded or swelled. Further, in some embodiments, the flexible membrane 1106 may be a plastic film that is configured to withstand the highest temperature reached by the operating device. Non-limiting examples of the flexible membrane 1106 may include polymeric materials, such as, but not limited to, polyurethane, silicone, rubbers, metal foil, polyether-based thermoplastic polyurethane, or combinations thereof. One specific example is a Dureflex® U073 membrane having a thickness of about 125 microns.

Moreover, in some embodiments, an adhesive material may be disposed on outer edges 1110 of the portion 1102 of the copper reservoir. The adhesive material may be used to couple the thermal interface device 1100 to the heat dissipater. On the other side, the thermal interface device 1100 may be soldered to the heat source. In the illustrated embodiment of FIGS. 11-12, a portion 1112 of the copper reservoir 1102 configured to be coupled to a heat source, such as an electronic chip may be thin sufficiently thin to be able to conform to a surface of the heat source. By way of example, the portion 1112 of the copper reservoir 1102 may be sufficiently thin to conform to a flat, convex or concave surface of the electronic chip.

Figure 13:
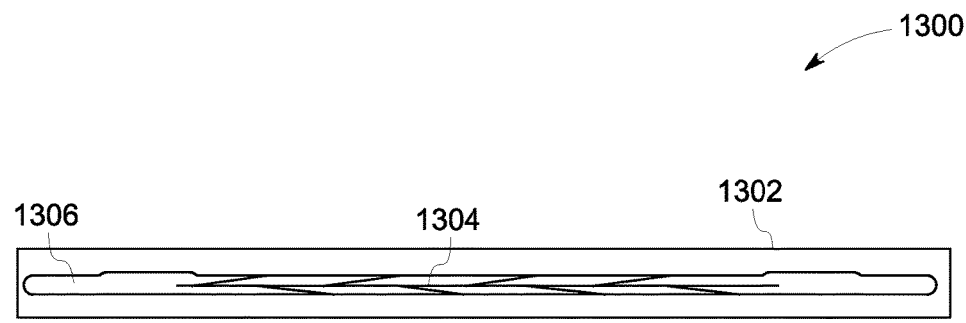
FIG. 13 is a cross-sectional view of a thermal interface device employing a shape changing component, in accordance with aspects of the present specification.

FIG. 13 illustrates a cross-sectional view of a thermal interface device 1300 of the present specification. In the illustrated embodiment, the thermal interface device 1300 includes a containment structure 1302 configured to contain a thermal conductor 1306 within. Further, the containment structure 1302 includes a shape changing component. In the illustrated embodiment, the shape changing component may include a multi-leaf spring 1304. The multi-leaf spring 1304 may be configured to reversibly expand or contract. For example, in assembly stage, the thermal interface device 1300 may be in a contracted state, whereas, in the operation stage the multi-leaf spring 1304 may expand to provide a change in volume of at least a portion of the containment structure 1302 to facilitate better thermal conduction between a heat source (not shown) and the thermal interface device 1300.

Figure 14:
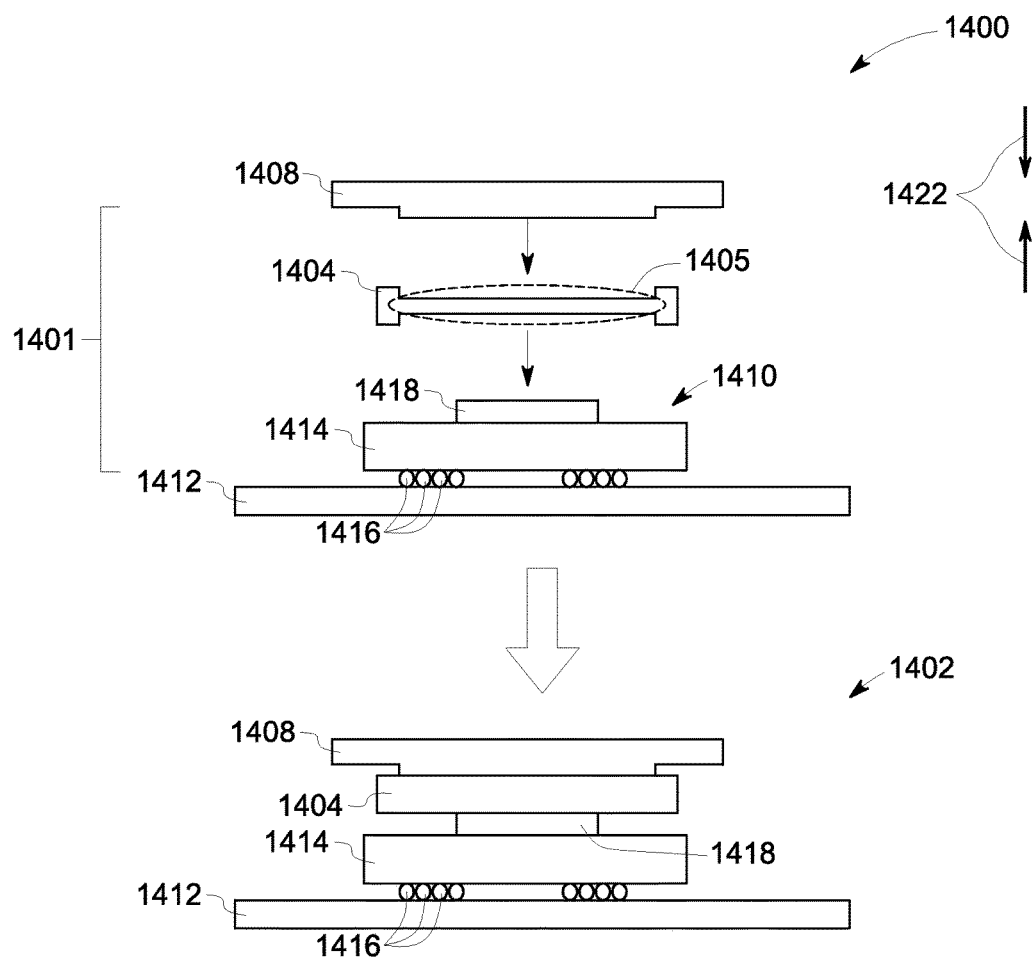
FIG. 14 is a schematic representation of a method of use of a thermal interface device, in accordance with aspects of the present specification.

FIG. 14 illustrates a schematic view 1400 of a method of use of a thermal interface device 1404 of the present specification. The schematic view 1400 represents a portion of an electronic system or electronic assembly employing a thermal interface assembly 1402 and a method of assembling the portion of the electronic system. In the illustrated embodiment, the reference numeral 1401 represents an exploded view of the thermal interface assembly 1402 prior to an assembly stage of the thermal interface assembly 1402. The thermal interface assembly 1402 employs a thermal interface device 1404. Further, the thermal interface assembly 1402 includes an electronic architecture having a heat sink 1408 and an electrical device 1410. The electrical device 1410 acts as a heat source in the thermal interface assembly 1402. The electrical device 1410 includes a printed circuit board (PCB) 1412 having an electrical device component 1414 attached thereto via a ball grid array (BGA) 1416. Further, the electrical device 1410 includes a silicon die 1418 that is a part of the electrical device component 1414.

The method begins by providing a thermal interface device 1404. The thermal interface device includes a containment structure (not shown) having at least one wall, and a thermal conductor (not shown) disposed at least in a portion of the containment structure. Next, in an assembly stage, at least a portion 1405 of the thermal interface device 1404 is compressed. In one embodiment, the thermal interface device 1404 may be heated before compressing the portion 1405. In this embodiment, the thermal interface device 1404 may be heated to a temperature suitable to melt the thermal conductor disposed at least in a portion of the containment structure of the thermal interface device 1404. Further, while the thermal conductor is still in the liquid state, the thermal interface device 1404 may be compressed in a direction 1422 to obtain a desirable thickness in the compressed portion 1405 of the thermal interface device 1404. In the compressed state, at least a portion of the thermal conductor may be displaced from the compressed portion 1405 of the thermal interface device 1404.

In some embodiments, the thermal interface device 1404 may employ conforming components (not shown), where the conforming components are configured to receive at least a portion of the displaced thermal conductor. Further, the thermal interface device 1404 may be allowed to cool after the compression to solidify the thermal conductor and to maintain a desirable thickness in the compressed portion 1405 of the thermal interface device 1404. Thereafter, the thermal interface device 1404 may be disposed in the thermal interface assembly 1402. In particular, the thermal interface device 1404 may be disposed between the silicon die 1418 of the electrical device 1410 and the heat sink 1408. The compressed portion 1405 enables an easy installation of the thermal interface device 1404 without disturbing neighboring components. Further, in the assembly stage, after disposing the thermal interface device 1404 having the compressed portion 1405 in the electronic system, the thermal interface device 1404 may be re-heated to melt the thermal conductor. Upon melting, at least a portion of the thermal conductor may be pushed towards the compressed portion 1405. Movement of the thermal conductor into the compressed portion may de-compress the compressed portion 1405 of the thermal interface device 1404 to at least in part regain the original shape of the thermal interface device 1404. In its near original shape, the thermal interface device 1404 is configured to be in physical contact with one or both of the electrical device 1410 and the heat sink 1408. In operating stage, the thermal interface device 1404 is connected to the silicon die 1418 to provide heat conduction path between the electrical device 1410 and the heat sink 1408 via the thermal interface device 1404.

Further, in some embodiment, shape changing components (not shown) may be employed to desirably expand the thermal interface device 1404 to facilitate enhanced physical contact between the thermal interface device 1404 and one or both of the heat sink 1408 and the electrical device component 1414. In the operation, electrical power may be provided to the electrical device 1410. Subsequently, after operation, the electrical power for the electrical device 1410 may be switched off, and if required, the electrical device 1410 may be detached from the assembly 1410 without any additional processing.

Advantageously, the thermal interface device 1404 may be configured to be directly disposed on the silicon die 1418. In particular, the thermal interface device 1404 may be configured to be operatively coupled to the silicon die 1418 without any additional need for a coupling media, or physical features to facilitate coupling between the thermal interface device 1404 and the silicon die 1418.

In addition, the thermal interface device of the present specification includes optimal thermal and mechanical properties and is compatible with the present standard electronic assembly processes. Non-limiting examples of such thermal and mechanical properties may include low bulk and interface thermal resistances, sufficient compliance to absorb thermally induced strain without causing early fatigue failure, sufficient conformability to accommodate surface roughness of the surfaces, ability to be processed at relatively low temperatures, robustness during storage and operation, and ability to be reworked and reused.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A thermal interface device, comprising:
a containment structure having at least one wall, wherein the containment structure is configured to facilitate passage of heat from a heat source; and
a thermal conductor disposed in at least a portion of the containment structure, wherein the thermal conductor is configured to reversibly switch between a solid state and a liquid state,
wherein the thermal interface device is a re-workable device; and
wherein the thermal interface device is coupled to the heat source without any additional coupling media, or physical features to facilitate coupling between the thermal interface device and the heat source.

2. The thermal interface device of claim 1, wherein the containment structure comprises a conformable reservoir.

3. The thermal interface device of claim 1, wherein a material for the containment structure consists of an electrically insulating polymer.

4. The thermal interface device of claim 1, wherein the containment structure comprises copper, graphene, silicone, aluminum, polyvinyl chloride, polyimide, polyurethane, polyester, polyamide, or combinations thereof.

5. The thermal interface device of claim 1, wherein a thickness of the at least one wall of the containment structure is in a range from about 1 nm to about 100 microns.

6. The thermal interface device of claim 1, further comprising an electrically insulating layer disposed on at least a portion of the containment structure.

7. The thermal interface device of claim 1, further comprising a diffusion barrier disposed between the thermal conductor and the at least one wall of the containment structure.

8. The thermal interface device of claim 1, further comprising one or more conforming components operatively coupled to the containment structure.

9. The thermal interface device of claim 8, wherein the one or more conforming components are disposed in the containment structure, disposed on the containment structure, or both.

10. The thermal interface device of claim 9, wherein the one or more conforming components are configured to receive at least a portion of the thermal conductor.

11. The thermal interface device of claim 8, wherein the one or more conforming components are bellows, flexible membranes, or combinations thereof.

12. The thermal interface device of claim 1, further comprising one or more shape changing components disposed in the containment structure, the thermal conductor, or both.

13. The thermal interface device of claim 12, wherein the one or more shape changing components are deformable meshes, spring like structures, or a combination thereof.

14. The thermal interface device of claim 1, wherein the thermal conductor comprises a metal alloy.

15. The thermal interface device of claim 1, wherein the thermal conductor further comprises a plurality of thermally conductive elements.

16. The thermal interface device of claim 15, wherein the plurality of thermally conductive elements comprises diamond, copper, carbon nanotubes, graphene, or combinations thereof.

17. The thermal interface device of claim 1, wherein a thickness of the thermal interface device is in a range from about 25 microns to 500 microns.

18. A thermal interface assembly, comprising:
a heat source;
a heat sink;
a thermal interface device disposed between the heat source and the heat sink, wherein the thermal interface device comprises:
a containment structure having at least one wall, wherein the containment structure is configured to facilitate passage of heat;
a thermal conductor disposed at least in at least a portion of the containment structure, wherein the thermal conductor is configured to reversibly switch between a solid state and a liquid state,
wherein the thermal interface device is a re-workable device; and
wherein the containment structure consists of an electrically insulating polymer.

19. The thermal interface assembly of claim 18, wherein the thermal interface device is directly disposed between the heat source and the heat sink.

20. The thermal interface assembly of claim 18, wherein the thermal interface device is configured to conform at least in part to at least a portion of the heat source.

21. The thermal interface assembly of claim 18, wherein the heat source is an active heat source, a passive heat source, or both.

22. A method for using a thermal interface device, comprising:
compressing at least a portion of the thermal interface device, wherein the thermal interface device comprises:
a containment structure having at least one wall, wherein the containment structure is configured to facilitate passage of heat;
a thermal conductor disposed in at least a portion of the containment structure, wherein the thermal conductor is configured to reversibly switch between a solid state and a liquid state, and wherein the thermal interface device is a re-workable device;
removably disposing the thermal interface device on at least a portion of a heat source;
disposing a heat sink directly on the thermal interface device;
de-compressing the compressed portion of the thermal interface device to provide a path of low thermal resistance between the heat source and the heat sink via the thermal interface device;
providing power to an electronic system, wherein the electronic system employs the heat source and the heat sink; and
wherein the thermal interface device is coupled to the heat source without any additional coupling media, or physical features to facilitate coupling between the thermal interface device and the heat source.

23. The thermal interface assembly of claim 18, wherein the thermal interface device is coupled to the heat source without any additional coupling media, or physical features to facilitate coupling between the thermal interface device and the heat source.

* * * * *